United States Patent [19]
Matsumoto et al.

[11] Patent Number: 4,692,843
[45] Date of Patent: Sep. 8, 1987

[54] MULTILAYER PRINTED WIRING BOARD

[75] Inventors: Masaru Matsumoto, Yamato; Mikio Nishihara, Tokyo; Kiyoshi Kuwabara, Yokohama, all of Japan

[73] Assignee: Fujitsu Limited, Kawasaki, Japan

[21] Appl. No.: 929,819

[22] Filed: Nov. 13, 1986

[30] Foreign Application Priority Data

Nov. 19, 1985 [JP] Japan ............... 60-176877[U]

[51] Int. Cl.$^4$ .............................................. H05K 1/14
[52] U.S. Cl. .................................. 361/414; 174/68.5; 228/180.1; 228/180.2; 361/412
[58] Field of Search ............... 174/68.5; 228/180.1, 228/180.2; 361/412, 414

[56] References Cited

U.S. PATENT DOCUMENTS

| | | | |
|---|---|---|---|
| 3,537,136 | 11/1970 | Healy et al. | 361/412 X |
| 3,591,839 | 7/1971 | Evans | 174/52 FP X |
| 3,616,532 | 11/1971 | Beck | 361/414 X |
| 3,829,601 | 8/1974 | Jeannote et al. | 361/414 X |
| 3,904,934 | 9/1975 | Martin | 361/412 |
| 3,936,930 | 2/1976 | Stern | 361/412 X |
| 4,216,350 | 8/1980 | Reid | 174/68.5 |
| 4,225,900 | 9/1980 | Ciccio et al. | 361/414 X |
| 4,368,503 | 1/1983 | Kurosawa et al. | 174/68.5 X |
| 4,394,712 | 7/1983 | Anthony | 174/68.5 X |
| 4,545,610 | 10/1985 | Lakritz et al. | 174/68.5 X |
| 4,581,680 | 4/1986 | Garner | 361/408 |
| 4,642,889 | 2/1987 | Grabbe | 361/413 X |

FOREIGN PATENT DOCUMENTS 1280356 10/1968 Fed. Rep. of Germany ...... 361/412
2728360 1/1978 Fed. Rep. of Germany ...... 361/412

OTHER PUBLICATIONS

Mescia et al., Interconnection for Stacked Substrates Having Integrated Chips, IBM. Tech. Disc. Bull., V. 16 #1, Jun. 1973, p. 38.

Primary Examiner—R. R. Kucia
Attorney, Agent, or Firm—Staas & Halsey

[57] ABSTRACT

A multilayer printed wiring board having an air gap between neighboring printed wiring boards of the multilayer printed wiring board by inserting plated spacers to both end faces of through-hole pads which are provided to each printed wiring board so that each through-hole pad opposes to another through-hole pad on the neighboring printed wiring board. The spacers opposed to each other are joined together by solder, and each spacer has an end surface having a size being smaller than a size of the end surface of each through-hole pad to provide a drop part at the joint part of the spacers, so that melted solder stays at the drop part not flowing toward the board through the side surface of the through-hole pad when the printed wiring boards are integrated to the multilayer printed wiring board under pressure and high temperature.

2 Claims, 8 Drawing Figures (a)

(b)

(c)

(d)

MULTILAYER PRINTED WIRING BOARD

BACKGROUND OF THE INVENTION

The present invention relates to a multilayer printed wiring board and particularly to a multilayer printed wiring board which stacks a plurality of printed wiring boards including an air gap between neighboring printed wiring boards of the multilayer printed wiring board.

An ordinary multilayer printed wiring board is fabricated by stacking a plurality of printed wiring boards inserting a prepreg, which is a sheet of semi-hardened resin, between neighboring printed wiring boards and pressing them under high temperature until they are unified into a hard board. However, a multilayer printed wiring board related to the present invention differs from the above multilayer printed wiring board in that the multilayer printed wiring board of the present invention has an air gap between neighboring printed wiring boards instead of the prepreg. In the multilayer printed wiring board having the air gaps, a plurality of through-hole pads are provided to each printed wiring board and each through-hole pad is commonly placed at the same position on each printed wiring board so that each through-hole pad opposes to another through-hole pad provided to the neighboring printed wiring board when the printed wiring boards are stacked. When the printed wiring boards are integrated, the air gap is left between the printed wiring boards adjacent to each other by inserting spacers into a joined part of the end faces of the through-hole pads provided to the printed wiring boards respectively. The multilayer printed wiring board having the air gaps has been disclosed by U.S. Pat. Nos. 4,368,503 and 4,528,072. According to the U.S. Patents, air gaps were provided for raising up transmission speed of signals each transmitted along a conductor pattern printed on the printed wiring board. Generally, when a signal is transmitted along a conductor pattern and there is a substance between the conductor pattern and another conductor pattern, such as an earth line or an earth plate, which runs near by the conductor pattern for the signal, the transmission speed of the signal is defined that the transmission speed is in inverse proportion to a square root of the dielectric constant of the substance.

In a case that a multilayer printed wiring board is fabricated into a hard board as mentioned before, since resin is usually used as the substance, the transmission speed of the signal becomes inverse proportion of a square root of the dielectric constant, such as 4.5 through 4.9, of the resin. Even though fluorine-contained polymer is used as the resin, the speed is scarcely improved as much as inverse proportion of a square root of its dielectric constant such as 2.3 through 2.9. Consequently, using no substance is most preferable for obtaining the highest speed of the signal. Actually, air is the most preferable substance because its dielectric constant is approximately 1.

FIGS. 1(a) through 1(d) are schematic partially sectional views of the prior art multilayer printed wiring board having the air gaps, and FIGS. 1(a) through 1(d) illustrate the fabrication process of the prior art multilayer printed wiring board. First, through-hole pads 3 and conductor patterns 2 and 2' are formed on a board 1 by etching and plate technique as shown in FIG. 1(a). Particularly, the through-hole pads 3 are formed at the same position to other boards respectively so that each though-pad is opposed to another through-hole pad on the neighboring board when the printed wiring boards are stacked. Second, a spacer is formed on each end face of each through-hole pad by plate technique as shown in FIG. 1(b). Third, a solder layer is formed on each end face of each spacer by plate technique, as shown in FIG. 1(c). The above process is applied to other boards respectively. Then, the printed wiring boards are stacked and integrated to a multilayer printed wiring board by joining spacers with melted solder layers under proper temperature and pressure. FIG. 1(d) partially illustrates the integrated printed wiring boards. In FIG. 1(d), a board 101 is one of boards being adjacent to the board 1, and a plurality of through-hole pads 103 each having a spacer 104 and conductor patterns 102 and 102' are formed on the board 101. The solder layer 5 plated on each spacer 4 and a solder layer plated on each spacer 104 which is not shown in FIG. 1(d), are melted, so that the through-hole pads 3 and 103, the spacers 4 and 104 would be respectively soldered as shown by solder 5' in FIG. 1(d). However, the solder 5' is depicted as an ideal soldering state. Actually, the melted solder flows as shown by solder 105' in FIG. 2. As a result, two problems will occur: one is a problem that a part of the solder 105' is easy to produce or happens to produce a short-circuit between the through-hole pad 103 and the conductor pattern 102 as shown in FIG. 2, and the other is a problem that the strength at the joined part of the spacers 4 and 104 becomes weak because the thickness of the solder around the joined part becomes thin as shown in FIG. 2. The problems have allowed to decrease production reliability of the multilayer printed wiring boards.

SUMMARY OF THE INVENTION

Accordingly, an object of the present invention is to avoid occurring a short-circuit problem due to the solder melted during the fabrication of the multilayer printed wiring board having the air gaps.

Another object of the present invention is to obtain excellent joined strength of integrated printed wiring boards of the multilayer printed wiring board having the air gaps.

A still another object of the present invention is to improve reliability of the multilayer printed wiring boards having the air gaps.

The above and other objects of the present invention are achieved by applying spacers each having an end face size being smaller than that of the through-hole pad. According to the small size spacers, the melted solder can be stayed around the periphery of the spacers joined to each other, avoiding the melted solder flowing out to a surface of the board through the side surface of the through-hole pad during fabrication.

DESCRIPTION OF THE PREFERRED EMBODIMENT

Figure 1:
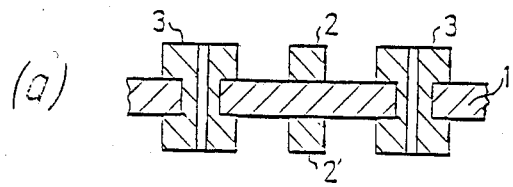
FIGS. 1(a) through 1(d) are schematic partially sectional views illustrating the fabrication process of the prior art multilayer printed wiring board.
Figure 1:
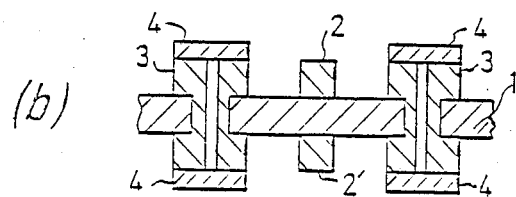
Figure 1:
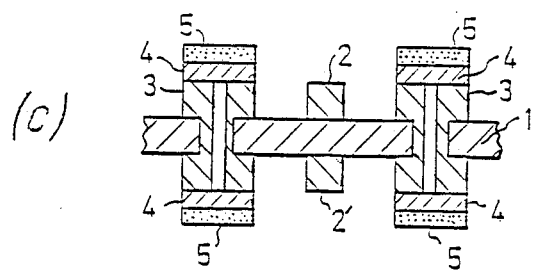
Figure 1:
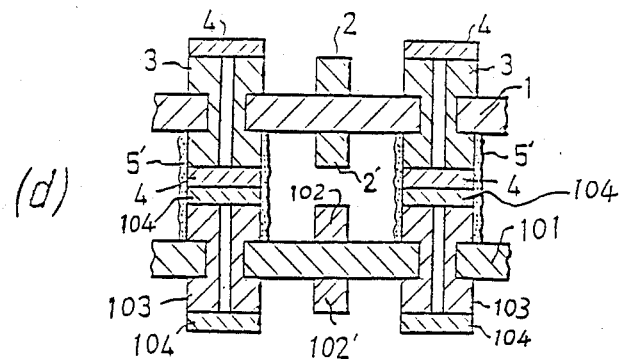
Figure 2:
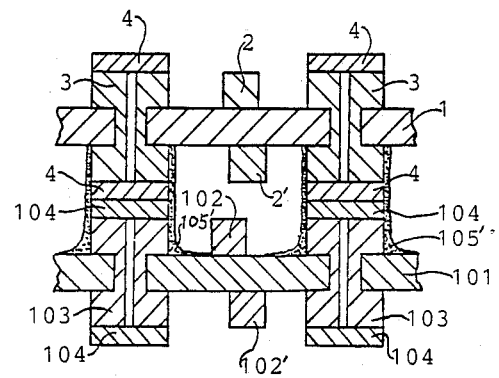
FIG. 2 is a schematic partially sectional view of the prior art multilayer printed wiring board, illustrating that melted solder produces a short-circuit problem.
Figure 3:
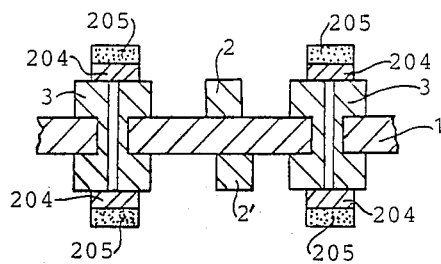
FIG. 3 is a schematic partially sectional view of the multilayer printed wiring board embodying the present invention.
Figure 4:
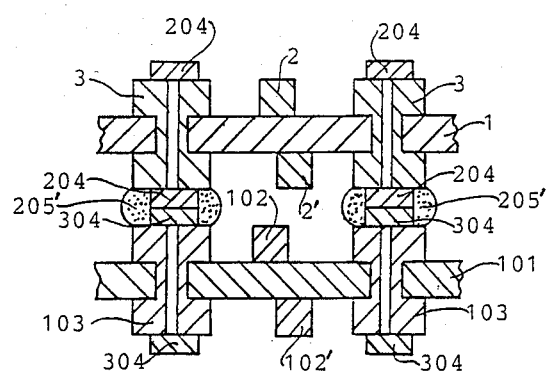
FIG. 4 is a schematic partially sectional view of the multilayer printed wiring board embodying the present invention, illustrating the integration of two printed wiring boards.
Figure 5:
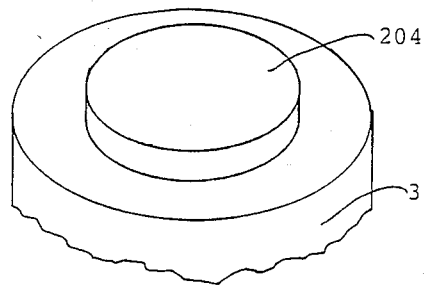
FIG. 5 is a schematic perspective view depicting a spacer plated on the end face of the through-hole pad of the multilayer printed wiring board embodying the present invention.

FIG. 3 schematically illustrates a sectional view of a printed wiring board of a multilayer printed wiring board embodying the present invention, and FIG. 4 schematically illustrates the melting state of solder when two printed wiring boards of FIG. 3 are integrated. In FIGS. 3 and 4, the same reference numerals as those in FIGS. 1 and 2 designate the same parts. As will be apparent in comparison between FIG. 1 and FIG. 3 or FIG. 2 and FIG. 3, the end face sizes of spacer 204 and 304 are set smaller than the end face sizes of the through-hole pads 3 and 103 respectively as indicated in FIG. 5. Accordingly, when printed wiring boards 1 and 101 are joined together with the spacers 204 and 304 aligned to each other under pressure and high temperature, melted solder 205' stays within a drop part formed by difference of the end face sizes of the through-hole pad 3 (103) and the spacer 204 (304) and does not flow toward the board 101 along the side surface of the through-hole pad 3 respectively. Therefore, the conductor pattern 102 on the board 101 is never shorted with the through-hole pad 103. Thereby, reliability of the multilayer printed wiring board having air gaps can be enhanced by applying the the present invention.

We claim:

1. A multilayer printed wiring board comprising:
a plurality of printed wiring boards each comprising a board and a plurality of conductor patterns provided onto said board;
a plurality of through-hole pads each made of electric conductor material, provided onto said board so as to pass through said board, arranged at the same position on said board as those on other said boards, having the same height from a surface of said board as those of other said pads on said board, and having an end face at both ends of said pad having the same size respectively as those of other said pads on said board and on other said boards;
a plurality of air gaps each provided between said printed wiring boards being adjacent to each other, for providing a designated space between surfaces of said conductor patterns provided respectively onto said printed wiring boards being adjacent to each other;
a plurality of spacers each made of electric conductor material, provided onto said both end faces of each said through-hole pad, joined to another said spacer provided to opposite said through-hole pad, having a thickness being adequate for providing said air gap, and having an end face having size being smaller than a size of said end face of said through-hole pad for providing a drop part around a periphery of said spacer looking from a side surface of said through-hole pad; and
solder which stays at each said drop part for joining said spacers and said through-hole pads, which are opposite to each other respectively, of said printed wiring boards being adjacent to each other.

2. A multilayer printed wiring board according to claim 1, wherein said through-hole pad comprising an end face of a circle shape and said spacer comprising an end face of a circle shape having a diameter being smaller than a diameter of said end face of said through-hole pad.

* * * * *

UNITED STATES PATENT AND TRADEMARK OFFICE
CERTIFICATE OF CORRECTION

PATENT NO. : 4,692,843

DATED : SEPTEMBER 8, 1987

INVENTOR(S) : MASARU MATSUMOTO ET AL.

It is certified that error appears in the above-identified patent and that said Letters Patent is hereby corrected as shown below:

```
FRONT PAGE [30] line 2, "60-176877[U]" should be
                --60-176876[U]--.

Col. 3, line 36, delete "the" (second occurrence).
```

Signed and Sealed this

Twenty-sixth Day of January, 1988

Attest:

DONALD J. QUIGG

*Attesting Officer*   *Commissioner of Patents and Trademarks*